(12) United States Patent
Zhang et al.

(10) Patent No.: US 10,755,947 B2
(45) Date of Patent: Aug. 25, 2020

(54) METHODS OF INCREASING SELECTIVITY FOR SELECTIVE ETCH PROCESSES

(71) Applicant: Applied Materials, Inc., Santa Clara, CA (US)

(72) Inventors: Wenyu Zhang, San Jose, CA (US);
Yixiong Yang, Fremont, CA (US);
Mario D. Sanchez, San Jose, CA (US);
Guoqiang Jian, San Jose, CA (US);
Wei V. Tang, Santa Clara, CA (US);
Paul F. Ma, Scottsdale, AZ (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/400,248

(22) Filed: May 1, 2019

(65) Prior Publication Data

US 2019/0341268 A1     Nov. 7, 2019

Related U.S. Application Data

(60) Provisional application No. 62/665,497, filed on May 1, 2018.

(51) Int. Cl.
*H01L 21/321* (2006.01)
*H01L 21/3213* (2006.01)
*H01L 29/49* (2006.01)

(52) U.S. Cl.
CPC .... *H01L 21/32135* (2013.01); *H01L 29/4966* (2013.01)

(58) Field of Classification Search
CPC .................................................. H01L 21/32135
See application file for complete search history.

(56) References Cited

U.S. PATENT DOCUMENTS

| | | | |
|---|---|---|---|
| 5,445,712 | A | 8/1995 | Yanagida |
| 6,149,828 | A | 11/2000 | Vaartstra |
| 6,290,864 | B1 | 9/2001 | Patel et al. |
| 6,547,977 | B1 | 4/2003 | Yan et al. |
| 7,193,500 | B2 | 3/2007 | Chinthakindi et al. |
| 9,449,843 | B1 | 9/2016 | Korolik et al. |
| 2014/0038420 | A1 | 2/2014 | Chen et al. |
| 2015/0118857 | A1 | 4/2015 | Liu et al. |

FOREIGN PATENT DOCUMENTS

WO      2018160493 A1      9/2018

OTHER PUBLICATIONS

Written Opinion of the International Searching Authority in PCT/US2019/030128, dated Aug. 16, 2019.
Shin, Hyungjoo, et al., "Selective etching of TiN over TaN and vice versa in chlorine-containing plasmas", Plasma Processing Laboratory, Department of Chemical and Biomolecular Engineering, University of Houston, Houston,, Apr. 18, 2013, 031305-1 to 03135-7.

*Primary Examiner* — Roberts P Culbert
(74) *Attorney, Agent, or Firm* — Servilla Whitney LLC

(57) ABSTRACT

Processing methods comprising etching a metal nitride layer with an etchant. The etchant can be, for example, $WCl_5$, $WOCl_4$ or $TaCl_5$. Methods of improving the selectivity of etch processes are also disclosed.

20 Claims, 1 Drawing Sheet

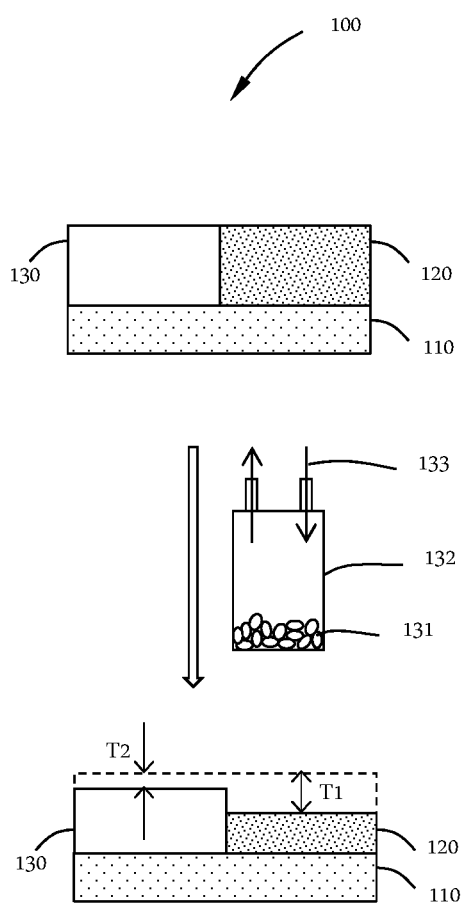

METHODS OF INCREASING SELECTIVITY FOR SELECTIVE ETCH PROCESSES

CROSS-REFERENCE TO RELATED APPLICATIONS

This application claims priority to U.S. Provisional Application No. 62/665,497, filed May 1, 2018, the entire disclosure of which is hereby incorporated by reference herein.

FIELD

The present disclosure relates to methods of etching thin films. In particular, the disclosure relates to processes for selectively etching metal nitride films for metal gate applications.

BACKGROUND

The semiconductor industry is rapidly developing chips with smaller and smaller transistor dimensions to gain more functionality per unit area. As the dimensions of devices continue to shrink, so does the gap/space between the devices, increasing the difficulty to physically isolate the devices from one another. Filling in the high aspect ratio trenches/spaces/gaps between devices which are often irregularly shaped with high-quality dielectric materials is becoming an increasing challenge to implementation with existing methods including gapfill, hardmasks and spacer applications.

Integrated circuits are made possible by processes which produce intricately patterned material layers on substrate surfaces. Producing patterned materials on a substrate requires controlled methods for removal of exposed material. Often it is useful to have an etch process which etches one material faster than another material. Such an etch process is said to be selective of the first material. As a result of the diversity of materials, circuits and processes, etch processes have been developed that selectively remove one or more of a broad range of materials.

Metal nitrides (e.g., TaN and TiN) are widely used in metal gate as high-k and n-metal capping, p-metal, or etch stop layers. In the advanced integration scheme (10 nm and beyond), it is common that both TaN and TiN are exposed on the surface before the sequential metal deposition. In order to achieve tunable work function, it can be useful to control the thickness of the substrate TaN or TiN before metal deposition.

Present methods of selectively etching one metal nitride over another do not display high levels of etch selectivity. Accordingly, processes which seek to utilize the present methods must deposit a larger quantity of the nitride films so that a longer etch may be performed in order to establish a sufficient difference in thickness between two metal nitride films. The deposition of thicker layers and longer etch processes requires additional processing time and material resources, thereby decreasing throughput and increasing manufacturing costs.

Therefore, there is a need in the art for new methods for selectively etching metal nitride films with increased selectivity.

SUMMARY

One or more embodiments of the disclosure are directed to an etch method that comprises providing a substrate having a metal nitride film thereon. The metal nitride film comprises atoms of a first metal and nitrogen atoms. The metal nitride film is exposed to a co-flow of an etchant and hydrogen gas to etch the metal nitride film. The etchant has an empirical formula comprising one or more atoms of a second metal, one or more atoms of oxygen and one or more atoms of a halogen.

Additional embodiments of the disclosure are directed to a selective etch method that comprises providing a substrate comprising a TaN material and a TiN material. The substrate is exposed to a coflow of a metal oxyhalide etchant and hydrogen gas to remove a first thickness of the TaN material and a second thickness of the TiN material. The first thickness is greater than the second thickness.

Further embodiments of the disclosure are directed to a method of improving etch selectivity. The method comprises providing a substrate comprising a TaN material and a TiN material. The substrate is exposed to a coflow of a metal halide etchant and hydrogen gas to remove a first thickness of the TaN material and a second thickness of the TiN material, the first thickness is greater than the second thickness, and a ratio of the first thickness to the second thickness is greater than a similar etch process performed without the hydrogen gas.

BRIEF DESCRIPTION OF THE DRAWING

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

The FIGURE illustrates a schematic representation of a processing method in accordance with one or more embodiment of the disclosure.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate", "substrate surface", or the like, as used herein, refers to any substrate or material surface formed on a substrate upon which processing is performed. For example, a substrate surface on which processing can be performed include, but are not limited to, materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate (or otherwise generate or graft target chemical moieties to impart chemical functionality), anneal and/or bake the substrate surface. In addition to processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. What a given substrate surface comprises will depend on what materials are to be deposited, as well as the particular chemistry used.

Some embodiments of this disclosure advantageously provide methods of etching a metal nitride film by a metal oxyhalide without the use of an oxygenating treatment. Some embodiments advantageously provide methods of selectively etching TaN over TiN without the use of an oxygenating treatment. Some embodiments of this disclosure advantageously provide methods of increasing the selectivity of metal nitride etch processes which utilize a metal and halogen containing etchant.

The FIGURE shows a schematic representation of an etching method 100 in accordance with one or more embodiment of the disclosure. A substrate 110 is provided which has at least one metal nitride film 120 thereon. As used in this regard the term "provided" means that the substrate is positioned in an appropriate location or environment for processing. In some embodiments, as shown, the substrate 110 further comprises a metal nitride film 130. A skilled artisan will recognize that the metal nitride film 130 is not necessary in some embodiments.

The metal nitride film 120 can be any suitable metal nitride. In some embodiments, the metal nitride film 120 comprises atoms of a first metal and atoms of nitrogen. The ratio of first metal atoms to nitrogen atoms may be any suitable ratio. The first metal may be any suitable metal. In some embodiments, the first metal is titanium or tantalum. In some embodiments, the metal nitride film 120 comprises TaN or TiN.

The metal nitride film 130 may be any suitable metal nitride film different from the metal nitride film 120. In some embodiments, the metal nitride film 120 comprises TaN and the metal nitride film 130 comprises TiN.

After providing the substrate 110, the metal nitride film 120 is exposed to a coflow of an etchant 131 and hydrogen gas to etch the metal nitride film 120. In some embodiments, the etchant 131 has an empirical formula comprising one or more atoms of a second metal, one or more atoms of oxygen and one or more atoms of a halogen. In some embodiments, the etchant 131 comprises substantially no plasma.

The second metal may be any suitable metal. In some embodiments, the second metal is tungsten, niobium or tantalum. In some embodiments, the first metal of the metal nitride film 120 and the second metal of the etchant 131 are the same. In some embodiments, the first metal of the metal nitride film 120 and the second metal of the etchant 131 are different.

In some embodiments, the one or more atoms of a halogen in the etchant 131 consist essentially of chlorine. As used in this regard, the term "consists essentially of chlorine" means that the atoms of halogen comprised in the etchant 131 are greater than 95%, 98%, 99% or 99.5% chlorine on an atomic basis.

In some embodiments, the etchant 131 is a metal oxyhalide. In some embodiments, the etchant 131 consists essentially of $WOCl_4$. As used in this regard, the term "consists essentially of" means that the stated species makes up greater than or equal to about 95%, 98%, 99% or 99.5% of the etchant on a molar basis.

In some embodiments, the etchant 131 is a solid reagent contained within an ampoule 132. The ampoule 132 can be any suitable ampoule for use with semiconductor processing and may include a heater (not shown), inlet and outlet. The ampoule 132 can be configured for vapor draw using a carrier gas 133. The ampoule 132 temperature can be controlled to sublimate solid reagents so that the carrier gas 133 can draw the reagent from the ampoule 132. In some embodiments, the etchant 131 comprises $WOCl_4$ and the ampoule 132 temperature is in the range of about 50° C. to about 90° C.

A suitable carrier gas 133 may comprise one or more of helium, nitrogen, argon, hydrogen, krypton or xenon. In some embodiments, the carrier gas 133 comprises or consists essentially of hydrogen gas ($H_2$). As used in this regard, the term "consists essentially of hydrogen gas" means that the carrier gas 133 is greater than or equal to about 95%, 98%, 99% or 99.5% hydrogen gas on a molar basis. In some embodiments, a carrier gas other than hydrogen is used to draw the reagent from the ampoule 132.

For embodiments in which a carrier gas other than hydrogen is used to draw the etchant from the ampoule, the carrier gas, after drawing the etchant, may be referred to as the etchant gas. In some embodiments, the flow rate of the etchant gas may be controlled. In some embodiments, the flow rate of the etchant gas is in a range of 10-2,000 sccm. In some embodiments, the flow rate of the hydrogen gas may be controlled. In some embodiments, the flow rate of the hydrogen gas is in a range of 50-10,000 sccm. In some embodiments, the ratio between the flow rate of the etchant gas and the flow rate of the hydrogen gas is in a range of about 4 to about 6 or equal to about 5.

In some embodiments, the etchant gas and the hydrogen gas are mixed prior to entering the processing chamber. In some embodiments, the etchant gas and the hydrogen gas are provided to the chamber separately.

In some embodiments, the hydrogen gas is delivered as a constant flow to the processing chamber while the etchant gas is flowed intermittently. In some embodiments, the etchant gas is delivered as a constant flow to the processing chamber while the hydrogen gas is flowed intermittently. In some embodiments, the etchant gas and the hydrogen gas are flowed alternately.

In some embodiments, the temperature of the substrate 110 is maintained throughout the method 100. Without being bound by theory, it is believed that etch processes performed at higher temperatures provide for faster removal of etched materials. Accordingly, in some embodiments, the substrate is maintained at a temperature in the range of about 50° C. to about 500° C., or about 100° C. to about 500° C., or about 300° C. to about 500° C., or about 400° C. to about 500° C., or about 450° C. to about 500° C., or about 400° C. to about 475° C., or about 400° C. to about 460° C. In some embodiments, the substrate is maintained at a temperature greater than or equal to about 400° C., greater than or equal to about 450° C., greater than or equal to about 460° C. In some embodiments, the substrate is maintained at a temperature of about 460° C.

Some embodiments of the disclosure advantageously provide methods which utilize metal oxyhalide etchants rather than metal halide etchants. Without being bound by theory, it is believed that the metal oxyhalide etchants decompose at higher temperatures. Accordingly, etch processes conducted at temperatures below the decomposition temperature of these etchants deposit a minimal amount of the metal of the metal oxyhalide etchant. In some embodiments, substantially no second metal is deposited on the substrate. As used in this regard, "substantially no" second metal mean that the average thickness of a second metal film is less 0.4 Å, less than 0.3 Å, less than 0.2 Å, or less than 0.1 Å for every 60 seconds that the substrate is exposed to the coflow of etchant and hydrogen gas.

Exposing the metal nitride film 120 to the coflow of etchant 131 and hydrogen gas removes a thickness T1 of the metal nitride film 120. As shown, in some embodiments, when present, exposing the metal nitride film 130 to the coflow of etchant and hydrogen gas removes a thickness T2 of the metal nitride film 130. In some embodiments, where the metal nitride film 120 comprises TaN and the substrate further comprises a TiN film, etching the metal nitride film 120 removes a greater thickness of the metal nitride film 120 than the metal nitride film 130. Stated differently, T1 is greater than T2.

Some embodiments of the disclosure provide for selective etch processes wherein the removal of TaN is favored over the removal of TiN. In some embodiments, the etchant 131 has an etch rate for the metal nitride film 120 that is greater than about 3 times, 4 times or 4.5 times the etch rate for the metal nitride film 130. Stated differently, the ratio of the first thickness to the second thickness is greater than or equal to about 3, greater than or equal to about 4, or greater than or equal to about 4.5.

Some embodiments of the disclosure advantageously provide method for enhancing or increasing the selectivity of an etch process by coflowing an etchant with hydrogen gas.

A substrate 110 comprising a TaN material and a TiN material is provided. The substrate is exposed to a coflow of a metal halide etchant and hydrogen gas to remove a first thickness of the TaN material and a second thickness of the TiN material. The first thickness is greater than the second thickness.

The metal halide etchant can be any suitable species comprising metal atoms and halogen atoms. In some embodiments, the metal halide etchant comprises or consists essentially of $WCl_5$, $NbCl_5$ or $WOCl_5$.

A ratio of the first thickness to the second thickness is greater with the coflow of hydrogen gas than a similar etch process performed without the hydrogen gas. As used in this regard, a "similar etch process" is one in which all other process parameters (substrate temperature, etchant, ampoule temperature, carrier gas flow rate, processing chamber pressure, etc.) are kept constant.

A standard process is a process which has not been improved by the addition of hydrogen gas. Accordingly, the carrier gas of the standard process comprises a carrier gas other than hydrogen. In some embodiments, the carrier gas other than hydrogen is replaced, in whole or in part, by hydrogen gas, such that the total flow rate of carrier gas (in sccm) provided to the processing chamber is the same.

According to one or more embodiments, the substrate 110 is subjected to processing after etching the metal nitride film. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present invention are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. An etch method comprising:
   providing a substrate having a metal nitride film thereon, the metal nitride film comprising atoms of a first metal and nitrogen atoms; and
   exposing the metal nitride film to a co-flow of an etchant and hydrogen gas to etch the metal nitride film, the etchant having an empirical formula comprising one or more atoms of a second metal, one or more atoms of oxygen and one or more atoms of a halogen.

2. The method of claim 1, wherein the metal nitride film comprises TaN or TiN.

3. The method of claim 1, wherein the etchant comprises substantially no plasma.

4. The method of claim 1, wherein the one or more atoms of a halogen in the etchant consist essentially of chlorine.

5. The method of claim 1, wherein the first metal and the second metal are different.

6. The method of claim 1, wherein the etchant consists essentially of $WOCl_4$.

7. The method of claim 1, wherein the etchant is a solid contained within an ampoule configured for vapor draw using hydrogen gas at an ampoule temperature.

8. The method of claim 7, wherein the etchant comprises $WOCl_4$ and the ampoule temperature is in a range of about 50° C. to about 90° C.

9. The method of claim 1, wherein the substrate is maintained at a temperature in a range of about 400° C. to about 460° C.

10. The method of claim 1, wherein substantially no second metal is deposited on the substrate.

11. The method of claim 1, wherein the metal nitride film comprises TaN and the substrate further comprises a TiN film.

12. The method of claim 11, wherein etching the metal nitride film removes a greater thickness of the metal nitride film comprising TaN than the TiN film.

13. A selective etch method comprising:
    providing a substrate comprising a TaN material and a TiN material; and
    exposing the substrate to a coflow of a metal oxyhalide etchant and hydrogen gas to remove a first thickness of the TaN material and a second thickness of the TiN material, the first thickness is greater than the second thickness.

14. The method of claim 13, wherein the metal oxyhalide etchant comprises halogen atoms consisting essentially of chlorine.

15. The method of claim 13, wherein the metal oxyhalide etchant consists essentially of $WOCl_4$.

16. The method of claim 15, wherein substantially no tungsten is deposited on the substrate.

17. The method of claim 13, wherein the substrate is maintained at a temperature in a range of about 400° C. to about 460° C.

18. The method of claim 13, wherein a ratio of the first thickness to the second thickness is greater than or equal to about 4.

19. A method of improving etch selectivity, the method comprising:
    providing a substrate comprising a TaN material and a TiN material; and
    exposing the substrate to a coflow of a metal halide etchant and hydrogen gas to remove a first thickness of the TaN material and a second thickness of the TiN material, the first thickness is greater than the second thickness, and a ratio of the first thickness to the second thickness is greater than a similar etch process performed without the hydrogen gas.

20. The method of claim 19, wherein the metal halide etchant comprises $WOCl_4$ and substantially no tungsten is deposited on the substrate.

* * * * *